United States Patent
Kanamitsu, Sr. et al.

(10) Patent No.: US 10,459,355 B2
(45) Date of Patent: Oct. 29, 2019

(54) TEMPLATE SUBSTRATE AND MANUFACTURING METHOD THEREOF

(71) Applicant: TOSHIBA MEMORY CORPORATION, Tokyo (JP)

(72) Inventors: Shingo Kanamitsu, Sr., Kanagawa (JP); Masamitsu Ito, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 272 days.

(21) Appl. No.: 15/263,954

(22) Filed: Sep. 13, 2016

(65) Prior Publication Data
US 2017/0115581 A1   Apr. 27, 2017

(30) Foreign Application Priority Data
Oct. 23, 2015 (JP) .................. 2015-208992

(51) Int. Cl.
*B29C 59/16* (2006.01)
*G03F 9/00* (2006.01)
*G03F 7/00* (2006.01)

(52) U.S. Cl.
CPC .......... *G03F 9/7042* (2013.01); *G03F 7/0002* (2013.01)

(58) Field of Classification Search
CPC .................. B29C 59/00; B29C 59/16
USPC ........................................... 425/385
See application file for complete search history.

(56) References Cited

U.S. PATENT DOCUMENTS

| | | |
|---|---|---|
| 8,758,005 B2 | 6/2014 | Itoh et al. |
| 9,377,682 B2 | 6/2016 | Kanamitsu et al. |
| 9,412,592 B2 | 8/2016 | Itoh et al. |
| 2010/0108639 A1 | 5/2010 | Kasano |
| 2011/0290134 A1 | 12/2011 | Itoh et al. |
| 2013/0001753 A1 | 1/2013 | Kanamitsu et al. |
| 2014/0256158 A1 | 9/2014 | Itoh et al. |

FOREIGN PATENT DOCUMENTS

| | | |
|---|---|---|
| JP | H8-335543 | 12/1996 |
| JP | 2000-114397 | 4/2000 |
| JP | 2010-228989 A | 10/2010 |
| JP | 2011-249567 | 12/2011 |
| JP | 2013-33907 | 2/2013 |
| JP | 2014-11254 | 1/2014 |
| WO | WO 20081126313 A1 | 10/2008 |

*Primary Examiner* — Joseph S Del Sole
*Assistant Examiner* — Thu Khanh T Nguyen
(74) *Attorney, Agent, or Firm* — Finnegan, Henderson, Farabow, Garrett & Dunner, L.L.P.

(57) ABSTRACT

A template substrate according to an embodiment includes a first face and a second face on an opposite side to the first face. A first region is located on the first face to be protruded from a peripheral portion thereof. A second region is located at least at an end portion of the first region, and is a region in which an alignment mark used at a time of transfer of a pattern is intended to be formed. The second region contains a first impurity and a second impurity.

8 Claims, 13 Drawing Sheets

TEMPLATE SUBSTRATE AND MANUFACTURING METHOD THEREOF

CROSS REFERENCE TO RELATED APPLICATIONS

This application is based upon and claims the benefit of priority from the prior Japanese Patent Application No. 2015-208992, filed on Oct. 23, 2015, the entire contents of which are incorporated herein by reference.

FIELD

The embodiments of the present invention relate to a template substrate and a manufacturing method thereof.

BACKGROUND

In recent years, nanoimprint technology has been developed as an alternative method to a photolithography technique in a manufacturing process of a semiconductor device. The nanoimprint technology is a technique that enables to transfer a pattern of a template (a replica template) to a resist located above a semiconductor substrate by pressing the template against the resist.

The pattern of the template includes an alignment mark to be used when the template is superimposed on the resist. However, the refractive index and transmittance of quartz as a material of the template with respect to visible light are close to those of the resist with respect to visible light. Accordingly, there is a risk that the alignment mark becomes difficult to see when the template is pressed against the resist.

DETAILED DESCRIPTION

A template substrate according to an embodiment includes a first face and a second face on an opposite side to the first face. A first region is located on the first face to be protruded from a peripheral portion thereof. A second region is located at least at an end portion of the first region, and is a region in which an alignment mark used at a time of transfer of a pattern is intended to be formed. The second region contains a first impurity and a second impurity.

Embodiments will now be explained with reference to the accompanying drawings. The present invention is not limited to the embodiments.

First Embodiment

Figure 1A:
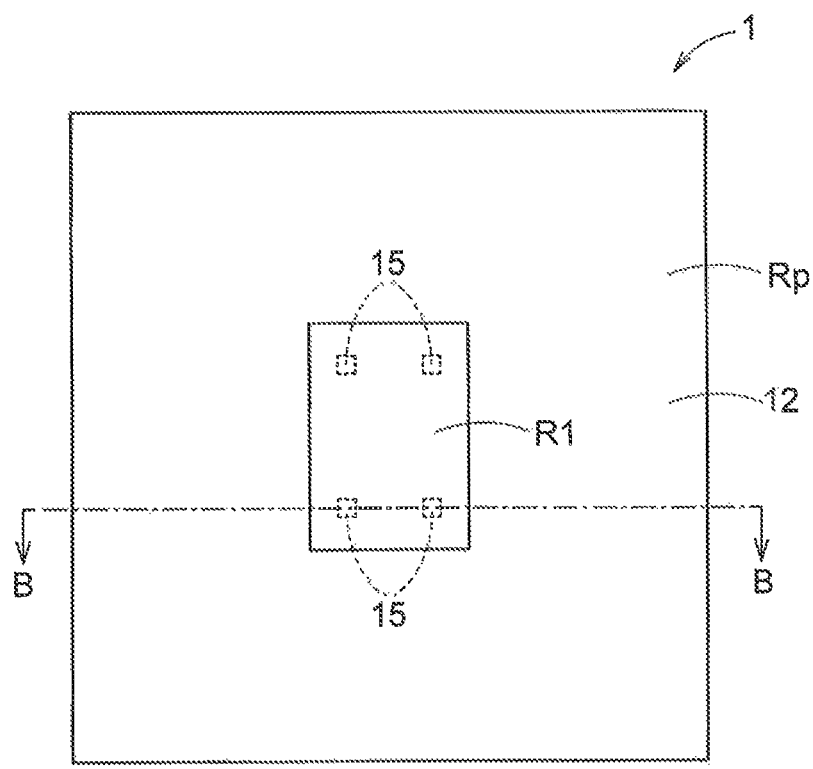
FIG. 1A is a plan view showing an example of a template substrate 1 according to a first embodiment.

FIG. 1A is a plan view showing an example of a template substrate 1 according to a first embodiment.

Figure 1B:
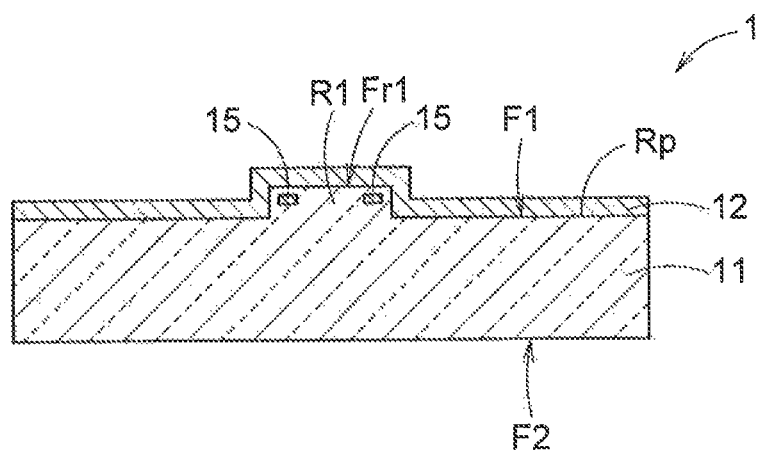
FIG. 1B is a sectional view showing the template substrate 1 along a line B-B in FIG. 1A.

FIG. 1B is a sectional view showing the template substrate 1 along a line B-B in FIG. 1A.

As shown in FIGS. 1A and 1B, the template substrate 1 includes a substrate 11 having a first face F1 and a second face F2 on the opposite side to the first face F1. The substrate 11 has a substantially rectangular shape as viewed from above the first face F1 as shown in FIG. 1A. For example, quartz is used as the substrate 11 and a visible light transmittance of the substrate 11 is high.

A mesa region R1 is provided as a first region on the first face F1 of the substrate 11. The mesa region R1 is protruded at a central portion of the first face F1 from the peripheral portion and a step is provided between the mesa region R1 and a region Rp peripheral thereto. The mesa region R1 has a substantially rectangular shape as viewed from above the first face F1, A pattern to be transferred to a resist on a semiconductor substrate is formed later in the mesa region R1. That is, the mesa region R1 is an intended region for transfer pattern formation. The mesa region R1 having the pattern formed is pressed against the resist on the semiconductor substrate and is used to transfer the pattern to the resist in a manufacturing process of a semiconductor device. That is, the template substrate 1 is a substrate of a template to be used in the so-called nanoimprint technology. The mesa region R1 is protruded to enhance adhesion to the resist when pressed against the resist, No transfer pattern is formed in the region (peripheral region) Rp of the substrate 11 other than the mesa region R1. The surface of the mesa region R1 and the surface of the peripheral region Rp can be substantially parallel to each other, Impurity implantation regions (Impurity introduction regions) 15 are provided at four corners (end portions) of the mesa region R1, respectively. The impurity implantation regions 15 are explained later with reference to FIG. 2.

A mask film 12 is provided on the first face F1. The mask film 12 is a thin film containing a metal and is, for example, chromium nitride film. The mask film 12 is used as a mask material when a pattern of a master template is transferred to a front surface Fr1 of the mesa region R1.

An example of dimensions is described. The substrate 11 is an about 152 millimeter square viewed from above and is about 6.35 millimeter thick. The mesa region R1 is a rectangle with a longitudinal length of about 33 millimeters and a transverse length of about 26 millimeters viewed from above and is about 30 micrometer high. The film thickness of the mask film 12 is, for example, about 5 to 10 nanometers.

Figure 2:
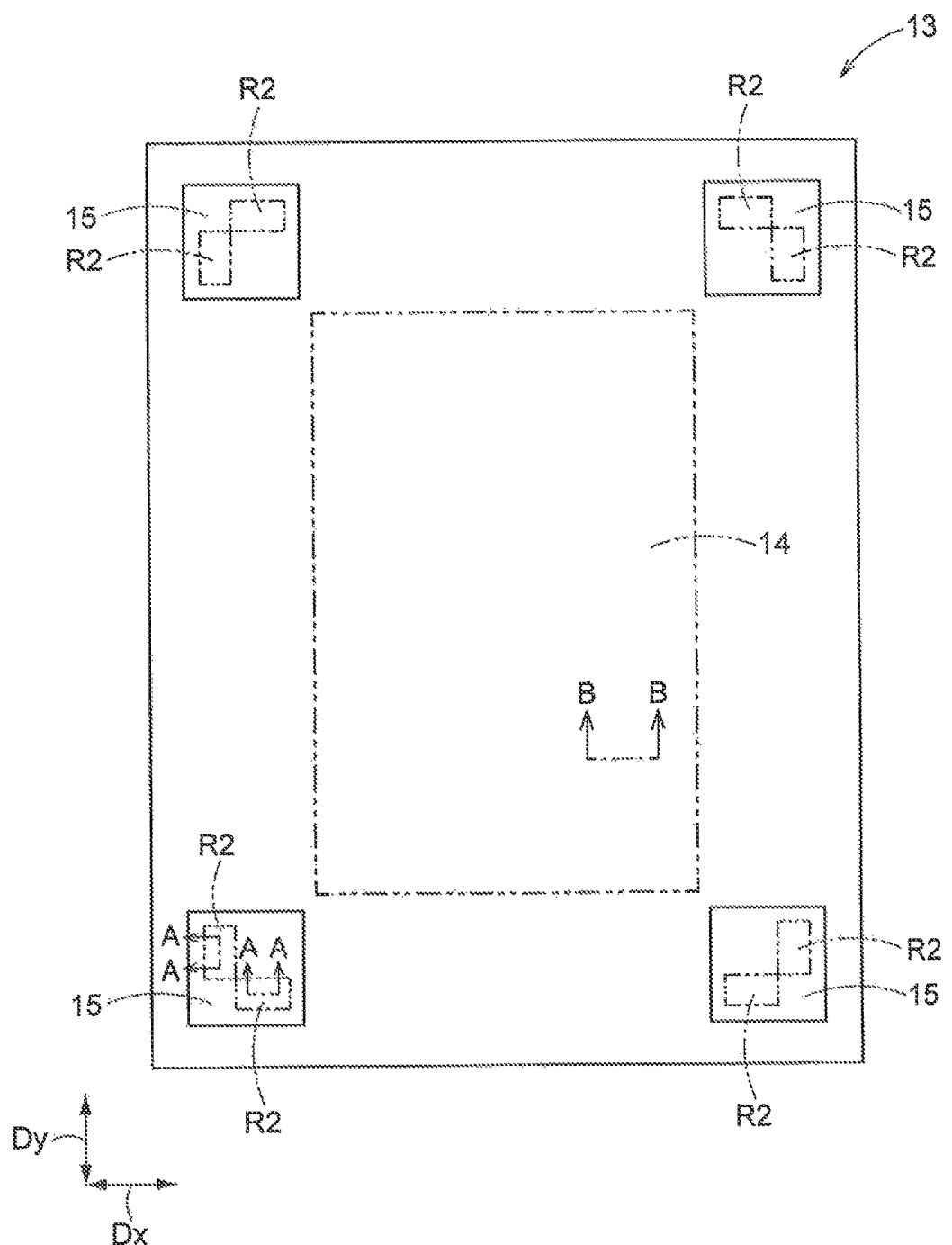
FIG. 2 is a plan view showing an example of the mesa region R1 of the template substrate 1.

FIG. 2 is a plan view showing an example of the mesa region R1 of the template substrate 1, The mesa region R1 includes a device region 14 and the impurity implantation regions 15. The device region 14 is located at a central portion of the mesa region R1 and is a region in which a device pattern is intended to be formed. The device pattern is formed when a replica template is produced using the template substrate 1. Therefore, the device pattern is not formed yet in the device region 14 of the template substrate 1.

The impurity implantation regions 15 are located at four corners (end portions) of the mesa region R1, respectively, and are provided at parts of a portion peripheral to the device region 14. An alignment-mark formation region R2 is formed in each of the impurity implantation regions 15. The alignment-mark formation region R2 as a second region is a region in which alignment marks used during pattern transfer are intended to be formed. The alignment marks are used for position alignment with the resist on the semiconductor substrate. The alignment marks are produced when a template is produced using the template substrate 1 similarly to the device pattern. Therefore, the alignment marks are not formed yet in the alignment-mark formation regions R2 of the template substrate 1.

As shown in FIGS. 1A to 2, impurities are locally implanted to the impurity implantation regions 15. As shown in FIG. 1B, the impurities are implanted at a depth between the front surface Fr1 of the mesa region R1 and the surface F1 of the peripheral region Rp. That is, the impurities are implanted (introduced) at a position deeper than the front surface Fr1 of the mesa region R1 and shallower than the front surface (the first face F1) of the peripheral region Rp.

The impurities include impurities of at least two kinds of elements. For example, the impurities include a first impurity and a second impurity. An implantation region of the first impurity and an implantation region of the second impurity overlap with each other at least partially and the first impurity and the second impurity are preferably implanted at substantially same depths. Therefore, respective maximum concentration values of the first and second impurities are located at positions deeper than the front surface Fr1 of the mesa region R1 and shallower than the front surface F1 of the peripheral region Rp and are preferably located at substantially same depths.

The first and second impurities are both metals and an ionization tendency of the second impurity is smaller than that of the first impurity. Furthermore, an atomic weight or mass of the second impurity is larger than that of the first impurity. The first impurity is, for example, at least one element among magnesium, titanium, aluminum, zirconium, and manganese. The second impurity is, for example, at least one element among chromium, molybdenum, zinc, cobalt, nickel, tin, lead, antimony, copper, silver, gold, and platinum.

Because the ionization tendency of the second impurity is smaller than that of the first impurity, it is considered that a large part of the first impurity is located as oxide in the impurity implantation regions 15 while a large part of the second impurity is located as it is without being oxidized in the impurity implantation regions 15. Due to implantation of the first impurity having a larger ionization tendency than the second impurity, the first impurity combines with oxygen in the impurity implantation regions 15 to be oxidized, which reduces oxygen in the impurity implantation regions 15. Accordingly, even with a small dose amount, the second impurity is not oxidized so much and can remain in the impurity implantation regions 15 as it is. Because the ionization tendency of the first impurity is relatively large, the first impurity can trap oxygen in the impurity implantation regions 15 efficiently even with a small dose amount. In this way, due to implantation of the first and second impurities even with a small total dose amount, the first impurity can trap oxygen in the impurity implantation regions 15 and the second impurity can remain as it is in the impurity implantation regions 15.

The atomic weight or mass of the first impurity is smaller than that of the second impurity. Therefore, small acceleration energy suffices to implant ions of the first impurity. Accordingly, when the first impurity is implanted in the impurity implantation regions 15, damages caused on the front surface Fr1 of the mesa region R1 are small.

To efficiently reduce the transmittance of the substrate 11 due to implantation of the impurities, it is preferable that the impurities be materials having a large refractive index and a large extinction coefficient (for example, the extinction coefficient $k \geq 3$). However, the refractive indices and the extinction coefficients of the impurities often become extremely small when the impurities are oxidized. In the first embodiment, a material having a relatively large refractive index and a relatively large extinction coefficient is used as the second impurity and a material having a larger ionization tendency than the second impurity is used as the first impurity, so that the second impurity can be left in the impurity implantation regions 15 without being oxidized while oxygen can be trapped by the first impurity. Accordingly, in the first embodiment, the transmittance of the substrate 11 in the impurity implantation regions 15 can be efficiently reduced with fewer impurities.

Figures 3A, 3B:
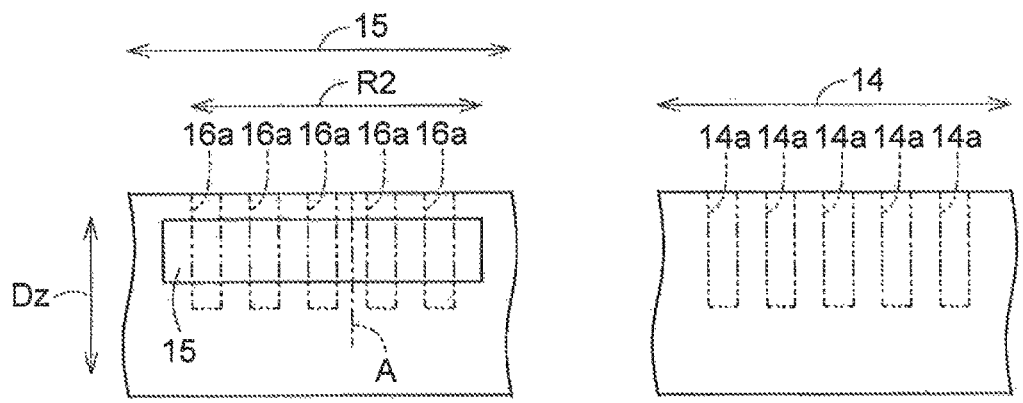
FIGS. 3A and 3B are sectional views showing an example of the mesa region R1 of the template substrate 1.

FIGS. 3A and 3B are sectional views showing an example of the mesa region R1 of the template substrate 1. FIG. 3A is a sectional view along a line A-A in FIG. 2 and FIG. 3B is a sectional view along a line B-B in FIG. 2. In FIG. 3A, a formation position of grooves 16a of the alignment mark is shown to indicate a relation between an implantation position (implantation depth) of impurities and the alignment mark. In FIG. 3B, a formation position of grooves 14a of the device pattern is shown.

As shown in FIG. 3A, the alignment mark is formed of the grooves 16a.

Figure 7:
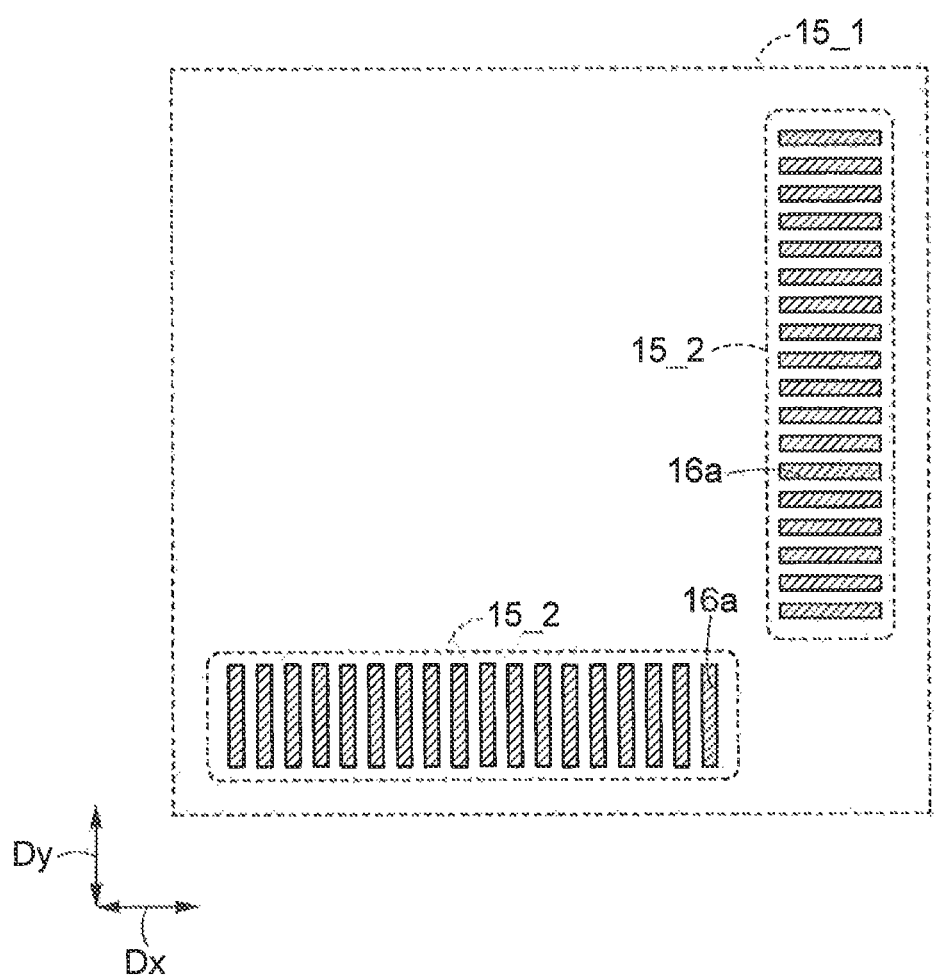
FIG. 7 is a plan view showing a relation between the impurity implantation region 15 and the alignment-mark formation region R2.

When the alignment mark is formed, the grooves 16a are arrayed in a Dx direction or a Dy direction on the first face F1 of the substrate 11 in the alignment-mark formation regions R2 and are provided substantially in parallel to each other (see FIG. 7). In this case, the alignment mark is a line-and-space pattern. Widths (space widths) of the grooves 16a or intervals (line widths) between adjacent grooves 16a can be equal. Alternatively, when moire stripes are to be generated at the time of alignment, the space widths or the line widths can be different from each other. That is, a pitch of the line-and-space pattern can be arbitrarily set. As shown in FIG. 2, each of the alignment-mark formation regions R2 includes the grooves 16a arrayed in the Dx direction and the grooves 16a arrayed in the Dy direction orthogonal to the Dx direction. This enables to achieve two-dimensional position alignment of a template in the Dx direction and in the Dy direction on a plane including the Dx direction and the Dy direction.

Furthermore, as shown in FIG. 3B, when the device pattern is formed on the template substrate 1, the grooves 14a are formed on the first face F1 of the substrate 11 in the device region 14. These grooves 16a and 14a can be formed continuously in the same process. Depths of the grooves 16a and the grooves 14a are substantially equal to each other and are, for example, about 60 nanometers. The impurity implantation regions 15 are located in a middle portion of the grooves 16a in a Dz direction (a direction perpendicular to the first face F1 and the second face F2, that is, a depth direction) of the substrate 11. That is, at the time of formation of the grooves 16a, the grooves 16a are formed to penetrate through the impurity implantation regions 15 in the Dz direction.

Figure 4:
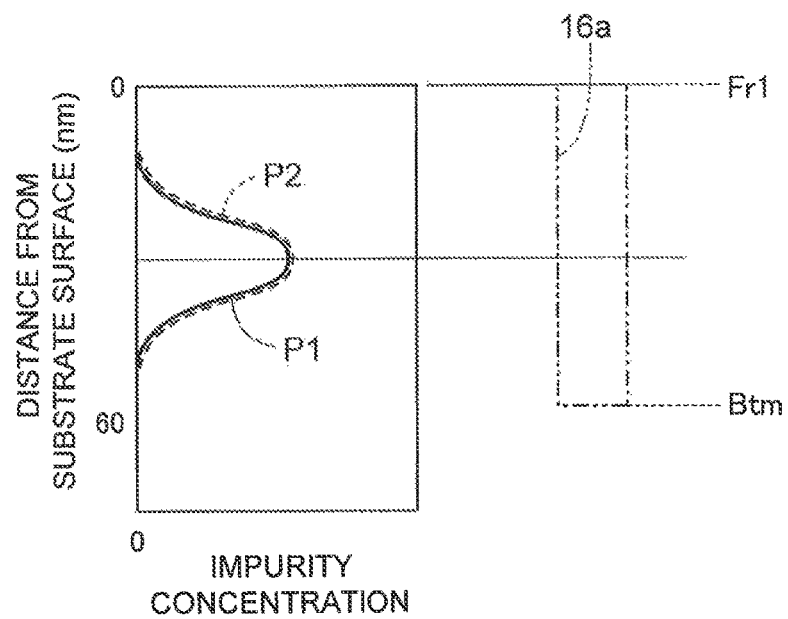
FIG. 4 is a graph showing concentration profiles of the impurities in the Dz direction along a line A in FIG. 3A.

FIG. 4 is a graph showing concentration profiles of the impurities in the Dz direction along a line A in FIG. 3A. The vertical axis represents the distance (depth) from the front surface Fr1 of the mesa region R1. The horizontal axis represents the impurity concentration. P1 indicates a concentration profile of the first impurity and P2 indicates a concentration profile of the second impurity, To show position relations between the impurity concentration profiles and the grooves 16a of the alignment mark, the groove 16a of the alignment mark is shown alongside in FIG. 4.

As shown in FIG. 4, the concentration profiles P1 and P2 of the first and second impurities in the Dz direction in the impurity implantation region 15 have the maximum values at a position closer to the front surface Fr1 of the mesa region R1 than a position Btm that is intended to be a bottom surface of the grooves 16a. That is, the maximum values of the concentration profiles P1 and P2 are located at a depth between the position Btm and the front surface Fr1. Accordingly, when the grooves 16a of the alignment mark are formed, the impurity implantation region 15 within the grooves 16a is removed. Meanwhile, the impurity implantation region 15 between the adjacent grooves 16a remains.

In the template substrate 1 according to the first embodiment, the first impurity and the second impurity are implanted to the impurity implantation regions 15 in the mesa region R1. The maximum concentration values of the first impurity and the second impurity are located at a position closer to the front surface Fr1 of the mesa region R1 than the position that is to be the bottom surface of the grooves 16a of the alignment marks. The second impurity is smaller in the ionization tendency than the first impurity. This enables the second impurity to be left in the impurity implantation regions 15 without being oxidized. At the time of template formation, the grooves 16a of the alignment marks are formed in the alignment-mark formation regions R2 in the impurity implantation regions 15. Because the grooves 16a of the alignment marks are deeper than the impurity implantation regions 15, the first and second impurities in the space patterns within the grooves 16a of the alignment marks are removed as described above. Therefore, the transmittance in the space patterns becomes the transmittance of the substrate 11 (quartz, for example) and is fairly high, Meanwhile, the first and second impurities are left in the line patterns between the adjacent grooves 16a, A material having a relatively large refractive index and a relatively large extinction coefficient is used as the second impurity, Therefore, in the line patterns, the transmittance can be effectively low. This increases a difference (contrast) in the transmittance between the space pattern and the line pattern of the alignment marks. That is, when the template substrate 1 according to the first embodiment is used, optical characteristics of the impurity implantation regions 15 can be sufficiently changed to increase the contrast in the alignment marks due to implantation of at least two kinds of impurities including the first and second impurities. As a result, a template created using the template substrate 1 can provide a high alignment accuracy in the alignment marks.

Figure 5:
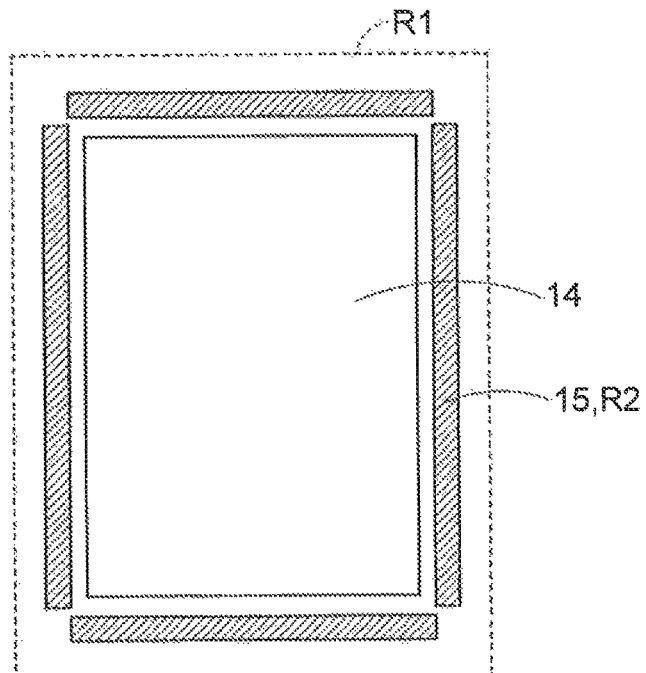
FIGS. 5 and 6 are plan views showing other examples of the mesa region R1.
Figure 6:
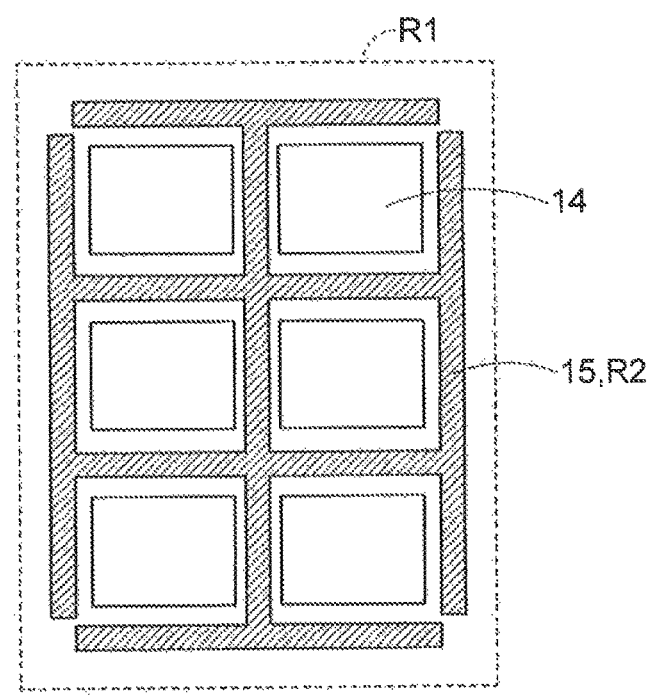

In the first embodiment, the impurity implantation regions 15 and the alignment-mark formation regions R2 are formed at four corners of the mesa region R1. However, the impurity implantation regions 15 and the alignment-mark formation regions R2 can be formed at lateral portions (lateral side portions) of the mesa region R1. For example, as shown in FIG. 5, the impurity implantation regions 15 and the alignment-mark formation regions R2 can be provided at four lateral side portions of the mesa region R1, When the device region 14 is divided into plural parts on the front surface of the mesa region R1 as shown in FIG. 6, the impurity implantation regions 15 and the alignment-mark formation regions R2 can be provided between adjacent parts of the device region 14 as well as at the four lateral side portions of the mesa region R1. FIGS. 5 and 6 are plan views showing other examples of the mesa region R1.

FIG. 7 is a plan view showing a relation between the impurity implantation region 15 and the alignment-mark formation region R2. It can be said that FIG. 7 is an enlarged view of one of the impurity implantation regions 15 and one of the alignment-mark formation regions R2 shown in FIG. 2. The alignment-mark formation region R2 includes the grooves 16a arrayed in the Dx direction and the grooves 16a arrayed in the Dy direction. The impurity implantation region 15 is set to include the entire alignment-mark formation region R2. Therefore, the impurity implantation region 15 can be set to include all the grooves 16a arrayed in the Dx direction and the Dy direction on the front surface Fr1 of the mesa region R1 as indicated by a dashed line 15_1, or can be set to include each of a group of the grooves 16a arrayed in the Dx direction and a group of the grooves 16a arrayed in the Dy direction as indicated by a dashed line 15_2, In either case, the alignment mark can be formed within the impurity implantation region 15 on the front surface Fr1 of the mesa region R1. The shape of the alignment mark is not limited to the line-and-space pattern and can be other patterns.

Generally, when semiconductor devices are mass-produced by the nanoimprint method, two kinds of templates including a master template and a replica template are prepared. The master template has a device pattern and an alignment mark formed, for example, by electron-beam printing on a flat-plate quartz substrate with no mesa region, Normally, only a single master plate is manufactured. Meanwhile, the replica template is manufactured using the master template by transferring the device pattern and the alignment mark to a template substrate on which the mesa region described above is formed. A semiconductor device is manufactured by transferring the patterns on the replica template to a semiconductor substrate. However, repeated transfer to semiconductor substrates gradually damages the device pattern and the alignment mark and thus the replica template is consumable. For this reason, a plurality of replica templates are manufactured using the master template. The template substrate 1 according to the first embodiment is, for example, a substrate for forming the replica templates.

A manufacturing method of the template substrate 1 is explained next.

Figure 8:
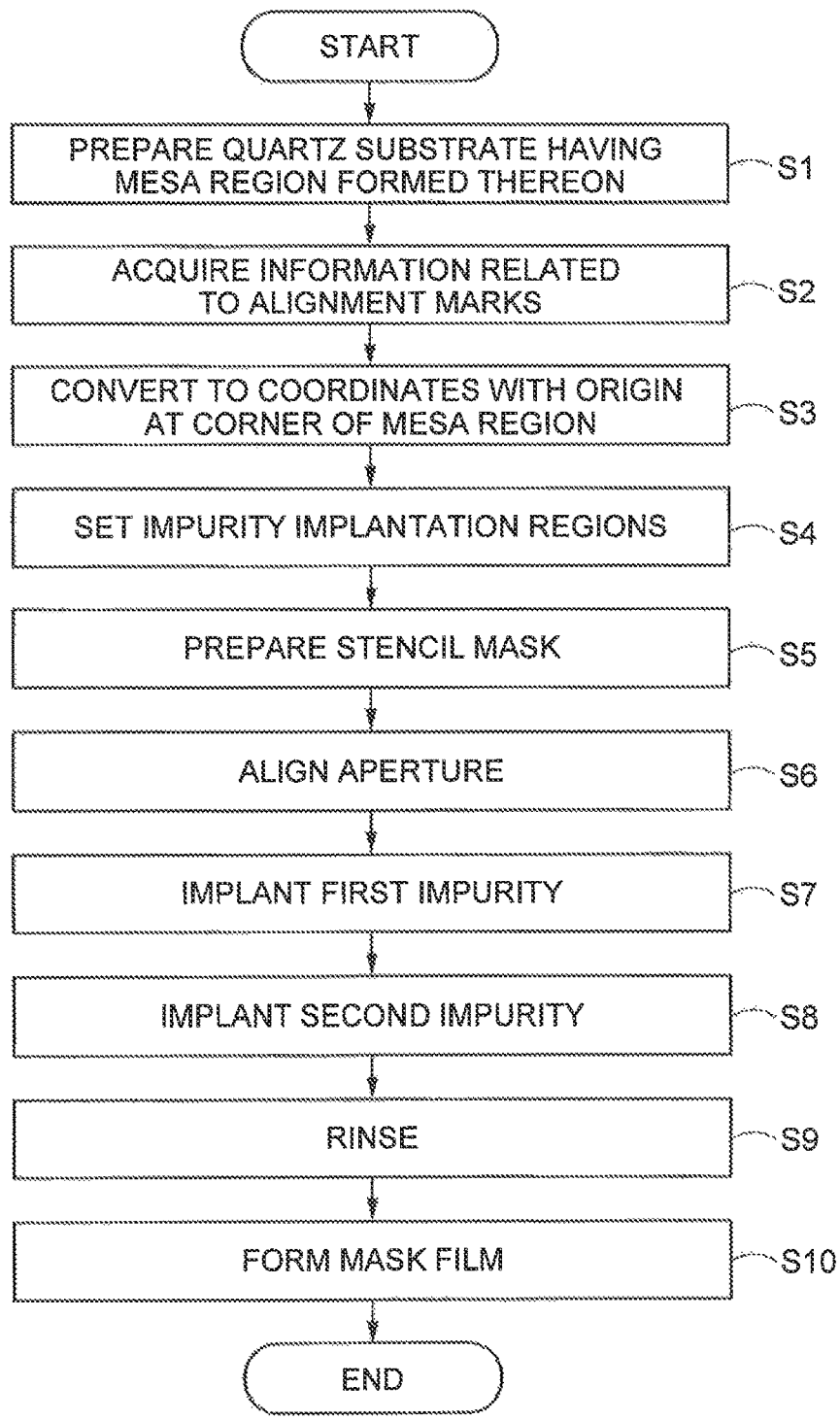
FIG. 8 is a flowchart showing a manufacturing method of the template substrate 1 according to the first embodiment.

FIG. 8 is a flowchart showing a manufacturing method of the template substrate 1 according to the first embodiment.

Figure 9A:
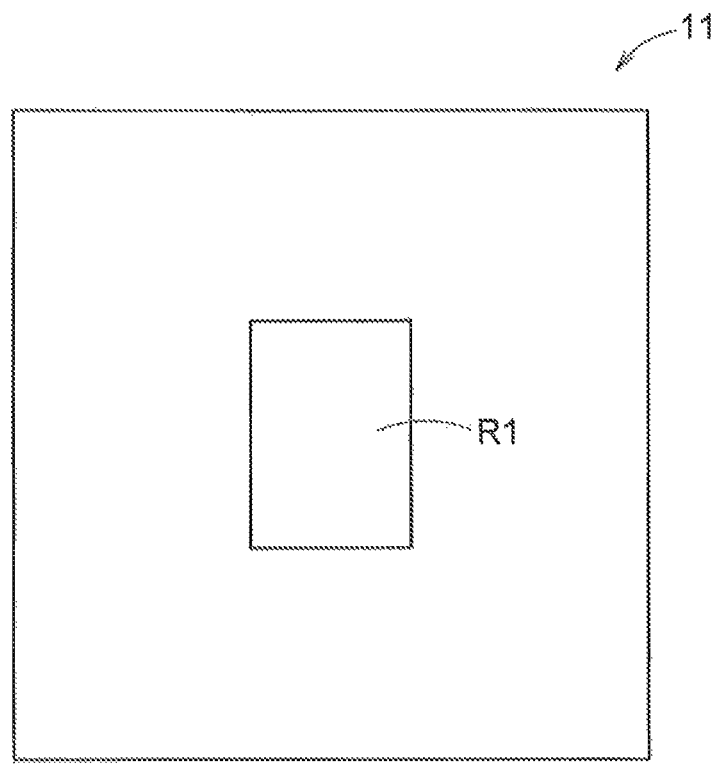
FIGS. 9A and 9B are a plan view and a sectional view showing an example of the substrate 11.
Figure 9B:
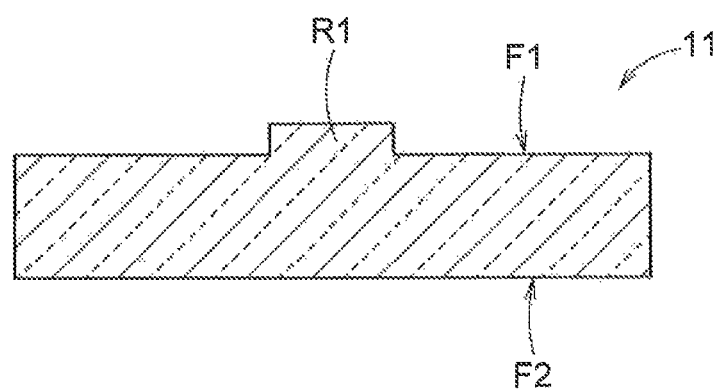

First, as shown in FIGS. 9A and 9B, the substrate 11 having the first face F1 and the second face F2 is prepared (Step S1). The substrate 11 is, for example, a quartz substrate having a high visible light transmittance. The substrate 11 is in a substantially square flat-plate shape having sides of about 152 millimeters, for example. The thickness of the substrate 11 is, for example, about 6.35 millimeters. The mesa region R1 is provided at the central portion of the first face F1 of the substrate 11. The mesa region R1 is formed, for example, by covering an intended formation region for the mesa region R1 with a resist film and etching the first face F1 other than the intended formation region for the mesa region R1. The mesa region R1 is, for example, in a rectangular shape with a longitudinal length of about 33 millimeters and a transverse length of about 26 millimeters and has a height of about 30 micrometers, for example.

Next, information related to alignment marks is acquired from design information of a mater template (Step S2), Specifically, information related to the number, positions, and size of the alignment-mark formation regions R2 is acquired. This information is generally described in a data format that enables use of CAD (Computer Aided Design).

Subsequently, a Cartesian coordinate system with an origin at a corner of the mesa region R1 is set. Based on this Cartesian coordinate system, coordinate data of the alignment-mark formation regions R2 is converted (Step S3). In this way, coordinates of the alignment-mark formation regions R2 can be described.

Next, the impurity implantation regions 15 are determined based on the position information of the alignment-mark formation regions R2 (Step S4). The impurity implantation regions 15 are set considering an error in an implantation position of an ion implantation device 100 (see FIG. 11). The error is an amount of deviation between a target position at the time of irradiation of an ion beam and a position where the ion beam is actually irradiated and is a value predicted statistically for each of ion implantation devices.

The impurity implantation regions 15 are set to include the alignment-mark formation regions R2, respectively, on the front surface Fr1 of the mesa region R1. Considering the error, an outer edge of each of the impurity implantation regions 15 is set at a position separated from an outer edge of the corresponding alignment-mark formation region R2 by a distance equal to or larger than the error. This enables impurities to be implanted reliably to the alignment-mark formation regions R2 even if an impurity implantation position is deviated within a range of the error.

Figure 10:
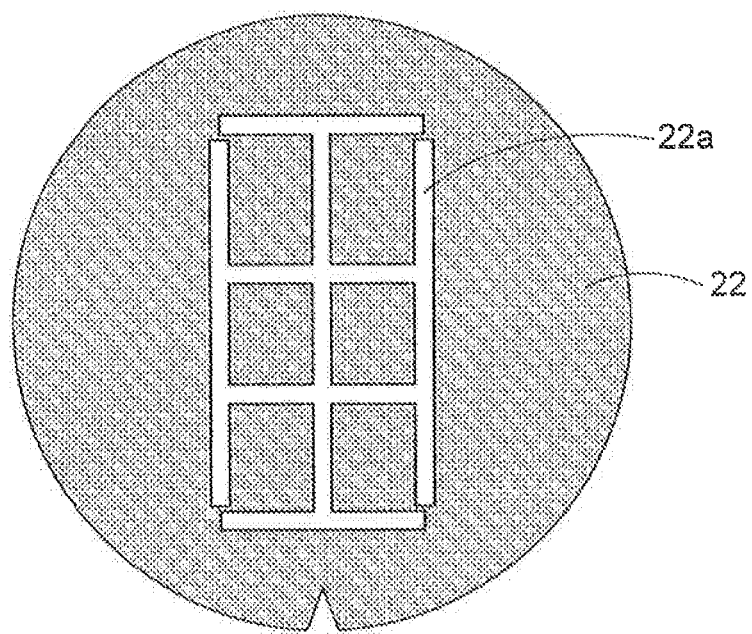
FIG. 10 is a plan view showing an example of the stencil mask 22.

Next, a stencil mask 22 corresponding to the impurity implantation regions 15 determined at Step S4 is prepared (Step S5). FIG. 10 is a plan view showing an example of the stencil mask 22, A conductive material such as a silicon substrate is used for the stencil mask 22. The stencil mask 22 has an aperture 22a that causes the impurities to pass through. The aperture 22a is formed to be wider than the alignment-mark formation regions R2 by a certain margin to implant ions of the impurities to the entire impurity implantation regions 15 including the corresponding alignment-mark formation regions R2. A region of the stencil mask 22 other than the aperture 22a prevents passage of the impurities, By implanting ions of the impurities using the stencil mask 22, the impurity implantation regions 15 can be formed at desired positions in the mesa region R1. On the stencil mask 22, an observation window (not shown) can be formed as well as the aperture 22a, While the stencil mask 22 shown in FIG. 10 corresponds to the impurity implantation regions 15 shown in FIG. 6, the stencil mask 22 can be formed to correspond to the impurity implantation regions 15 shown in FIG. 2 or 5 by changing the aperture 22a of the stencil mask 22.

Next, the stencil mask 22 and the substrate 11 are attached to the ion implantation device 100 and are aligned (Step S6), A configuration of the ion implantation device 100 is explained briefly below.

Figure 11:
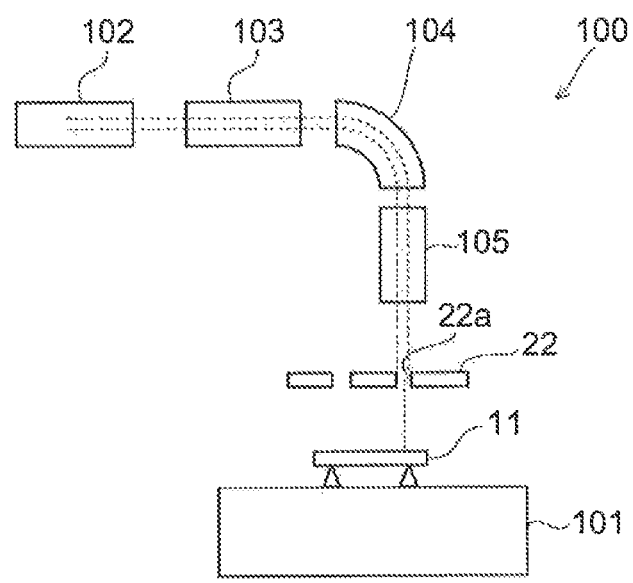
FIG. 11 shows an example of a configuration of the ion implantation device 100.

FIG. 11 shows an example of a configuration of the ion implantation device 100, The ion implantation device 100 includes a stage 101, an ion source chamber 102, an acceleration mechanism 103, a mass spectrometry magnet 104, and a beam optical system 105, The stage 101 can have the substrate 11 mounted thereon and can move the substrate 11 for position alignment. The ion source chamber 102, the acceleration mechanism 103, the mass spectrometry magnet 104, and the beam optical system 105 constitute a path of impurity ions. The stencil mask 22 is placed between the beam optical system 105 and the stage 101 to be interposed in the path of the impurity ions. The stencil mask 22 is placed immediately above the substrate 11.

Next, the ion implantation device 100 implants ions of the first impurity selectively to the substrate 11 according to the aperture 22a of the stencil mask 22 (Step S7). For example, in a case where aluminum is used as the first impurity, an aluminum compound is set in the ion source chamber 102 and heated while an extraction voltage is applied to the acceleration mechanism 103. In this way, aluminum ions are extracted from the ion source chamber 102 and accelerated by the acceleration mechanism 103. The aluminum ions are caused to pass through the mass spectrometry magnet 104 to enhance the purity of the aluminum ions and the aluminum ions are transformed to parallel beams by the beam optical system 105, The aluminum ion beams pass through the aperture 22a to form a shape corresponding to the impurity implantation regions 15, with which the substrate 11 is irradiated. For example, the dose amount is set to about $2 \times 10^{15}$ to $5 \times 10^{16}$ ions/cm$^2$ and the acceleration voltage is set to 22 kilovolts or lower. In this case, the impurity is implanted to a shallow region having a depth of about 60 nanometers or smaller. Preferably, the first impurity is implanted to a position about half the depth of the grooves 16a formed at the time of manufacturing a template, as a target position. For example, in a case where the depth of the grooves 16a from the first face F1 is about 60 nanometers, ions of the first impurity are implanted to a position (depth) of about 30 nanometers from the front surface Fr1 of the mesa region R1 as a target. Accordingly, the concentration profile of the first impurity has a substantially normal distribution having the maximum value at an almost central position of the grooves 16a in the depth direction (Dz direction). As a result, a large part of the first impurity is implanted to a depth between the front surface Fr1 of the mesa region R1 and the bottom surface Btm of the grooves 16a.

Figure 12A:
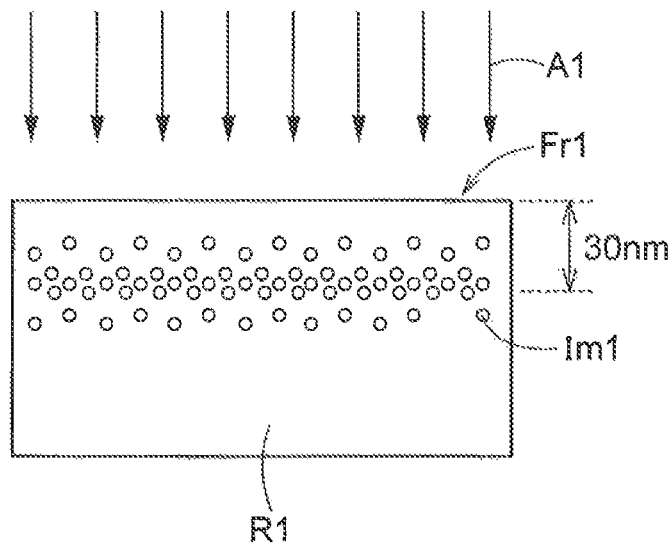
FIG. 12A shows a process of implanting ions of a first impurity Im1.

FIG. 12A shows a process of implanting ions of a first impurity Im1. Ions of the first impurity Im1 are implanted to the mesa region R1 as indicated by arrows A1, The first impurity is implanted to a depth of, for example, about 30 nanometers from the front surface Fr1 of the mesa region R1 as a target position.

As described above, the first impurity is a material larger in the ionization tendency than the second impurity and smaller in the atomic weight or mass than the second impurity and is, for example, at least one element among magnesium, titanium, aluminum, zirconium, and manganese. For example, in a case where aluminum is used as the first impurity, aluminum is implanted to a position (depth) of about 30 nanometers when ions are implanted at an acceleration voltage of about 22 kilovolts. Because aluminum has a relatively large ionization tendency, it is considered that aluminum combines with oxygen in the impurity implantation regions 15 to become aluminum oxide. Furthermore, because aluminum has a relatively small atomic weight or mass, small acceleration energy suffices for ion implantation and the front surface Fr1 of the mesa region R1 is not scraped so much. Therefore, damages caused on the front surface Fr1 of the mesa region R1 are small.

Subsequently, the ion implantation device 100 implants ions of the second impurity selectively to the substrate 11 according to the aperture 22a of the stencil mask 22 (Step S8). For example, in a case where antimony is used as the second impurity, it suffices to set antimony in the ion source chamber 102. It is unnecessary to change the stencil mask 22 and the position thereof, By replacing the ion source with antimony and changing the mass spectrometry magnet, the acceleration voltage, and the like, the second impurity can be implanted to a position substantially same as that of the first impurity. Other operations of the ion implantation device 100 can be identical to those at Step S7. Accordingly, antimony ion beams pass through the aperture 22a to be formed in a shape corresponding to the impurity implantation regions 15, with which the substrate 11 is irradiated. For example, the dose amount is set to about $2 \times 10^{16}$ to $5 \times 10^{16}$ ions/cm$^2$ and the acceleration voltage is set to 60 kilovolts or lower. In this case, the impurity is implanted to a shallow region having a depth of about 60 nanometers or smaller. The dose amounts of the first and second impurities can be controlled using a current amount of the ion beams and the implantation time. For example, in a case where a current density of the ion beams is 1 µA/cm$^2$, the impurity with a dose amount of about $3.25 \times 10^{15}$ ions/cm$^3$ can be implanted when ion beam irradiation is performed for about 10 minutes.

Figure 12B:
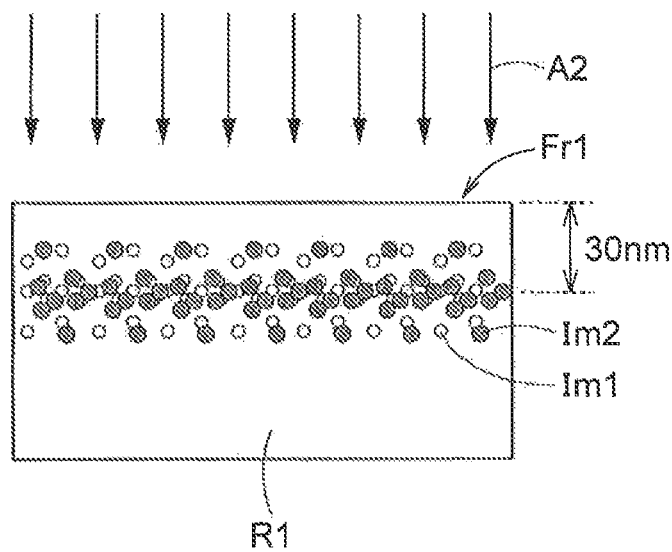
FIG. 12B shows a process of implanting ions of a second impurity Im2.

FIG. 12B shows a process of implanting ions of a second impurity Im2. Ions of the second impurity Im2 are implanted to the mesa region R1 as indicated by arrows A2, The second impurity is implanted to a depth of, for example, about 30 nanometers from the front surface Fr1 of the mesa region R1 as a target position. Therefore, ions of the second impurity Im2 are implanted to the same target position as that of the first impurity Im1 and are implanted to a region overlapping with the first impurity Im1.

The second impurity is a material smaller in the ionization tendency than the first impurity and larger in the atomic weight or mass than the first impurity and is, for example, at least one element among chromium, molybdenum, zinc, cobalt, nickel, tin, lead, antimony, copper, silver, gold, and platinum. For example, in a case where antimony is used as the second impurity, antimony is implanted to a position (depth) of about 30 nanometers when ions are implanted at an acceleration voltage of about 60 kilovolts. Aluminum has a larger ionization tendency than antimony and thus traps oxygen in the impurity implantation regions 15 (is likely to be oxidized). Accordingly, antimony in the impurity implantation regions 15 is less likely to be oxidized and intrinsic optical characteristics of antimony can be sufficiently provided with a relatively small dose amount. While antimony is larger in the atomic weight than aluminum, damages on the front surface Fr1 of the mesa region R1 can be reduced when the dose amount of antimony is set to be relatively small.

The impurity implantation regions 15 are formed by such ion implantation of the first and second impurities to the mesa region R1. As described above, the first impurity combines with oxygen atoms in the impurity implantation regions 15. Accordingly, oxidation of the second impurity is suppressed and the second impurity can be located in the impurity implantation regions 15 with the intrinsic optical characteristics relatively kept. That is, use of a material having a large refractive index and a large extinction coefficient as the second impurity can reduce the visible light transmittance in the impurity implantation regions 15.

Next, the substrate 11 is rinsed to remove particles having adhered to the surface and contaminations having adhered thereto due to implantation of impurity ions (Step S9).

Subsequently, a material of the mask film 12 is deposited on the first face F1 of the substrate 11 using, for example, a sputtering method (Step S10). The material of the mask film 12 can be, for example, chromium nitride. The template substrate (replica blank) 1 shown in FIGS. 1A and 1B is thereby completed.

A manufacturing method of a replica template using the template substrate according to the first embodiment is explained next.

Figure 13:
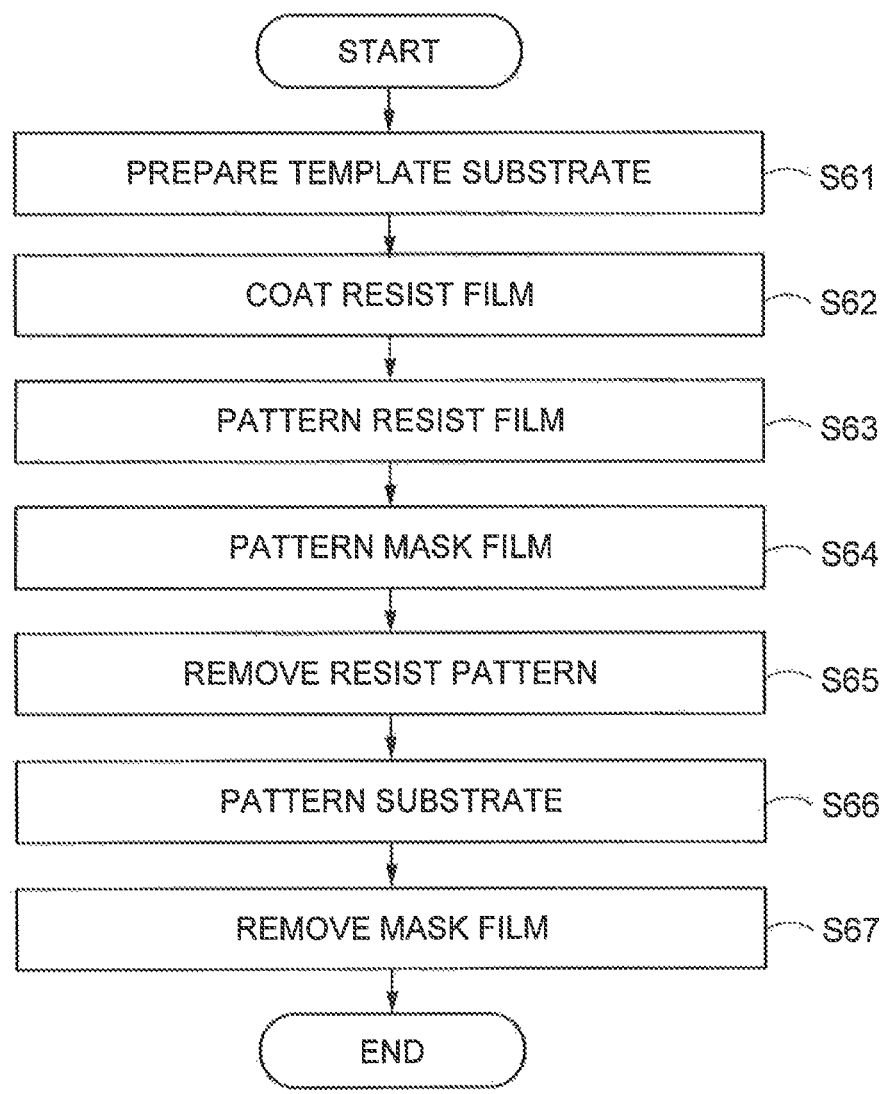
FIG. 13 is a flowchart showing an example of a manufacturing method of a replica template according to the first embodiment.

FIG. 13 is a flowchart showing an example of a manufacturing method of a replica template according to the first embodiment. FIGS. 14A to 14G are sectional views showing an example of the manufacturing method of a replica template according to the first embodiment.

Figure 14A:
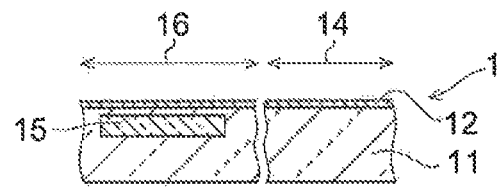
FIGS. 14A to 14G are sectional views showing an example of the manufacturing method of a replica template according to the first embodiment.

First, as shown in FIG. 14A, the template substrate 1 according to the first embodiment is prepared (Step S61). As described above, the device region 14 and alignment mark regions 16 are set on the template substrate 1.

Figure 14B:
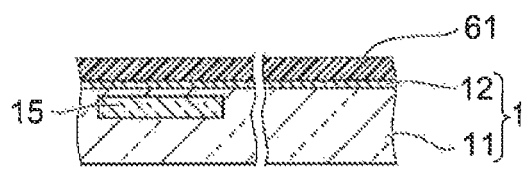

Next, as shown in FIG. 14B, an ultraviolet-curing resist film 61 is coated on the entire first face F1 of the template substrate 1 (Step S62). Generally, the resist film 61 is coated by placing minuscule liquid droplets at a density corresponding to a pattern using an ink-jet mechanism or the like, which is uniformly extended by causing a mater template described later to adhere tightly thereto.

Figure 14C:
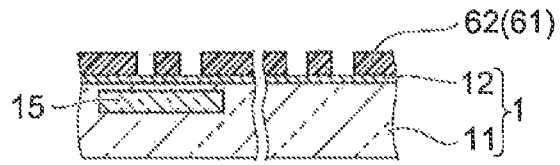

Next, the master template (not shown) is pressed against the template substrate 1 to transform the resist film 61 coated on the mesa region R1 to a shape of the pattern of the master template. For example, the resist film 61 is irradiated in this state with ultraviolet light having a wavelength of about 365 nanometers to cure the resist film 61. Accordingly, the pattern of the mater template is transferred to the resist film 61 to form a resist pattern 62 as shown in FIG. 14C, In the resist pattern 62, the device pattern and the alignment marks are formed. The master template is thereafter pulled away from the template substrate 1 and the resist pattern 62.

Figure 14D:
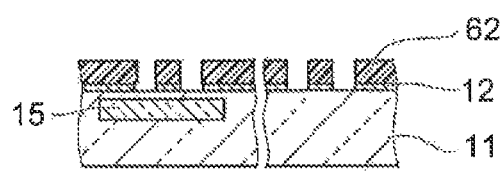

Subsequently, as shown in FIG. 14D, dry etching is performed with etching gas that contains chlorine using the resist pattern 62 as a mask. Accordingly, the mask film 12 being chromium nitride is etched to transfer the pattern of the resist pattern 62 to the mask film 12 (Step S64).

Figure 14E:

Next, the resist pattern 62 is removed as shown in FIG. 14E (Step S65).

Figure 14F:
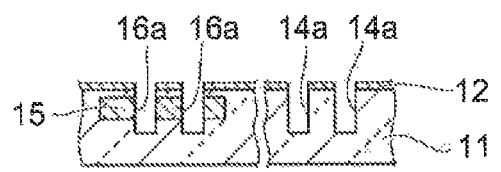

Subsequently, as shown in FIG. 14F, dry etching is performed with etching gas that contains fluorine using the mask film 12 as a mask. Accordingly, the substrate 11 being quartz is etched to form the grooves 14a in the device region 14 and form the grooves 16a in the alignment mark regions 16 (Step S66). The device pattern is constituted of the grooves 14a and the alignment marks are constituted of the grooves 16a. The grooves 14a and 16a are formed to be deeper than the lower surface of the impurity implantation regions 15 and are, for example, formed at a depth of about 60 nanometers. Accordingly, the grooves 16a penetrate through the impurity implantation regions 15.

Figure 14G:
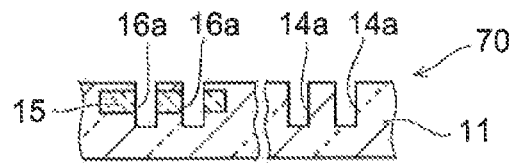

Next, as shown in FIG. 14G, wet etching with cerium nitrate is performed to remove the mask film 12, A replica template 70 is thereby completed.

A semiconductor device is manufactured by performing the nanoimprint technology using the replica template 70 formed in this way. For example, an ultraviolet-curing resist material (not shown) is coated on a semiconductor substrate (not shown) such as a silicon wafer and irradiation with ultraviolet light is performed in a state where the replica template 70 is pressed against the resist material, thereby forming a resist pattern on the semiconductor substrate. At that time, position alignment between the replica template 70 and the semiconductor substrate is achieved by superimposing the alignment marks formed on the replica template 70 on the alignment marks formed on the semiconductor substrate and observing these alignment marks using white light with a wavelength of, for example, about 530 nanometers. While these alignment marks are both patterns in which a plurality of grooves are arrayed periodically, the periods of the grooves slightly differ from each other. Accordingly, a moire pattern is generated when the both marks are superimposed, and the position of the moire pattern changes if a relative position relation between the marks changes. This enables the relative position relation between the marks to be amplified and detected and thus the replica template 70 can be positioned with respect to the semiconductor substrate at a high accuracy.

Furthermore, as shown in FIG. 2, the alignment marks include the grooves 16a arrayed in the Dx direction and the Dy direction orthogonal to each other. Such alignment marks are provided on both the replica template 70 and the semiconductor substrate. Therefore, the alignment marks can be positioned relatively to the semiconductor substrate in the Dx direction and the Dy direction.

Next, the semiconductor substrate is processed using the resist pattern as a mask. This processing can be, for example, etching or impurity implantation. For example, when etching is performed using the resist pattern as a mask, the semiconductor substrate or a material film on the semiconductor substrate can be selectively etched. Alternatively, when an impurity is implanted selectively using the resist pattern as a mask, an impurity diffusion film can be formed on the semiconductor substrate or a material film on the semiconductor substrate. A semiconductor device can be formed in this way.

As described above, according to the first embodiment, the first impurity is first implanted to the impurity implantation regions 15 to have the maximum concentration value at a position closer to the front surface Fr1 of the mesa region R1 than a position being the bottom surface Btm of the grooves 16a of the alignment marks. Next, the second impurity is implanted at an identical position to that of the first impurity. Accordingly, the implantation regions of the first and second impurities overlap in the impurity implantation regions 15. Because the second impurity is smaller in the ionization tendency than the first impurity, the second impurity can be left in the impurity implantation regions 15 without being oxidized.

Figure 15:
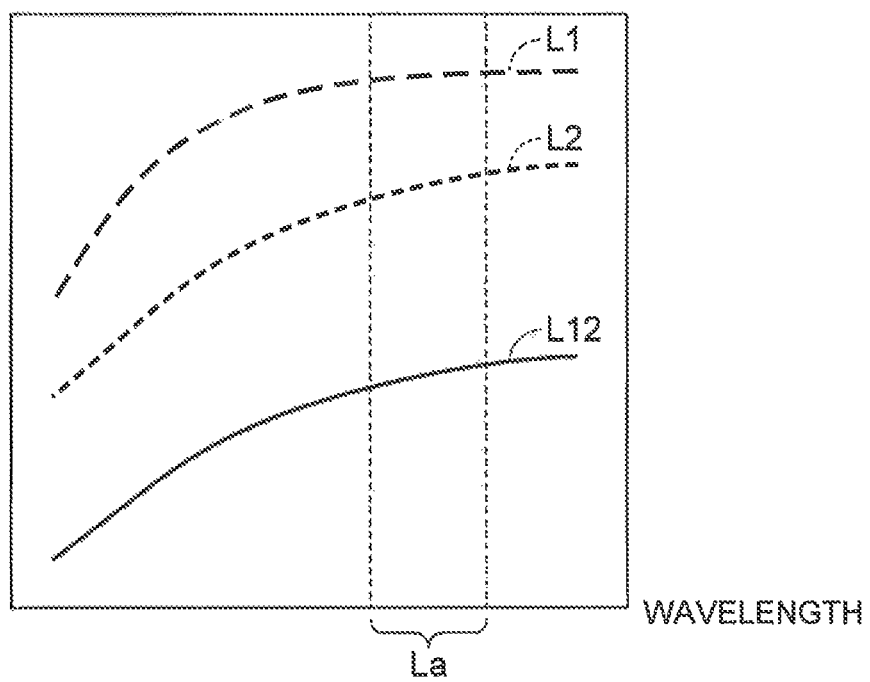
FIG. 15 is a graph showing the light transmittance of the template substrate 1 in the impurity implantation regions 15.

FIG. 15 is a graph showing the light transmittance of the template substrate 1 in the impurity implantation regions 15. The horizontal axis represents the wavelength of light and the vertical axis represents the light transmittance. A wavelength band La is a wavelength band of light to be used when position alignment between a template and a semiconductor substrate is performed. A line L1 indicates a transmittance in a case where only the first impurity Im1 is implanted. A line L2 indicates a transmittance in a case where only the second impurity Im2 is implanted. A line L12 indicates a transmittance in a case where the first and second impurities Im1 and Im2 are both implanted.

In the case where only the first impurity Im1 (aluminum, for example) is implanted, the transmittance of the substrate 11 hardly decreases in the wavelength band La. This is because the first impurity Im1 is oxidized in the impurity implantation regions 15, which increases the transmittance.

In the case where only the second impurity Im2 (antimony, for example) is implanted, the transmittance of the substrate 11 is still high in the wavelength band La while somewhat decreasing. Assuming that the transmittance of quartz (the substrate 11) including no impurities is 100%, the transmittance indicated by the line L2 in the wavelength band La is, for example, 80%. This is because the second impurity Im2 is somewhat oxidized in the impurity implantation regions 15 although the second impurity Im2 is smaller in the ionization tendency than the first impurity Im1.

On the other hand, in the case where both the first and second impurities Im1 and Im2 (aluminum and antimony, for example) are implanted, the transmittance of the substrate 11 considerably decreases (about 30% or lower, for example) in the wavelength band La. This is because the first impurity Im1 combines with oxygen in the impurity implantation regions 15 to be oxidized and a large part of the second impurity Im2 is left as it is in the impurity implantation regions 15. When the first impurity Im1 is magnesium and the second impurity Im2 is cobalt, the transmittance indicated by the line L12 is, for example, about 40% or lower in the wavelength band La.

As described above, according to the first embodiment, the light transmittance in the wavelength band La in the impurity implantation regions 15 can be decreased. Therefore, when the grooves 16a of the alignment marks are formed, a large difference (contrast) in the transmittance between the line pattern and the space pattern can be obtained. That is, when a semiconductor device is manufactured using the replica template formed from the template substrate 1 according to the first embodiment, a highly-sensitive alignment signal can be acquired and the replica template can be accurately aligned with a semiconductor substrate.

If only the first impurity is used, it is difficult to greatly change the optical characteristics of the impurity implantation regions 15 because the first impurity has a relatively large ionization tendency and is likely to be oxidized. If only the second impurity is used, the dose amount of the second impurity is increased because the second impurity is also oxidized while having a relatively small ionization tendency. Because the second impurity is large in the atomic weight or mass, the front surface Fr1 of the mesa region R1 is scraped when a large quantity of ions is implanted. Furthermore, large distortion occurs inside the mesa region R1. Therefore, when only either the first impurity or the second impurity is used, it is difficult to sufficiently change the optical characteristics of the impurity implantation regions 15 with a small dose amount.

On the other hand, according to the first embodiment, the first and second impurities are implanted and thus a sufficient change in the optical characteristics of the impurity implantation regions 15 can be achieved easily with a small total dose amount.

Second Embodiment

Figure 16A:
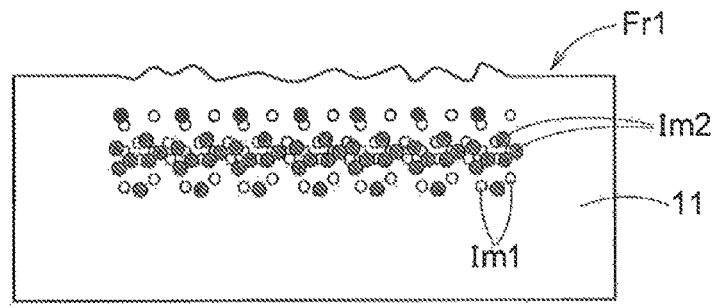
FIGS. 16A to 16C are sectional views showing an example of a manufacturing method of the template substrate 1 according to a second embodiment.
Figure 16B:
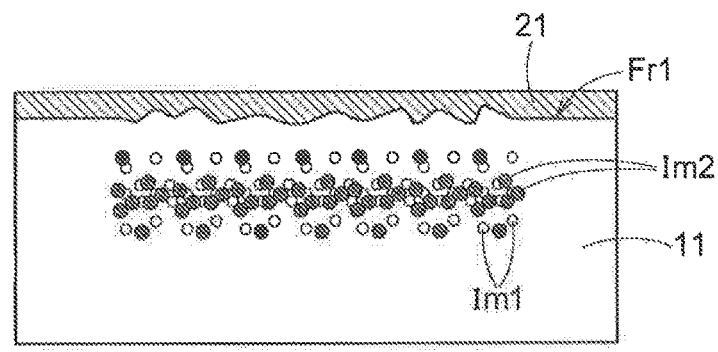
Figure 16C:
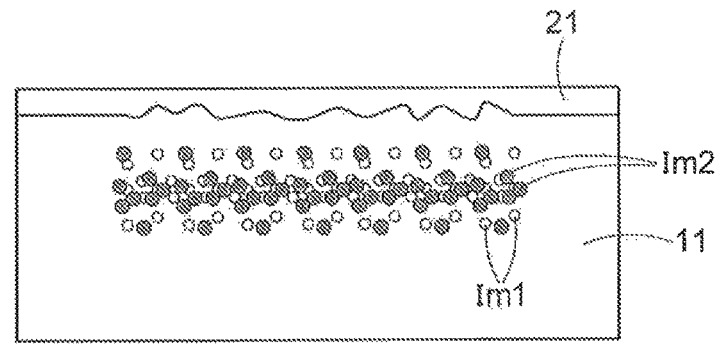

FIGS. 16A to 16C are sectional views showing an example of a manufacturing method of the template substrate 1 according to a second embodiment.

While not damaged so much, the front surface Fr1 of the mesa region R1 is scraped to some extent by implantation of the first and second impurities and thus may become non-flat as shown in FIG. 16A, For this reason, in the second embodiment, after implantation of the first and second impurities, a SOG (Spin On Glass) 21 being a glass film is coated on the front surface Fr1 of the mesa region R1 as shown in FIG. 16B, Thereafter, the template substrate 1 and the SOG 21 are thermally treated to be integrated with each other. This enables the front surface Fr1 of the mesa region R1 to be substantially flat.

In this case, the concentration profiles of the first and second impurities become deeper by a thickness of the SOG 21. However, when the thickness of the SOG 21 is limited, the concentration profiles of the first and second impurities can be kept shallower than the depth of the grooves 16a of the alignment marks. For example, in a case where the grooves 16a have a depth of about 60 nanometers and the first and second impurities are implanted to a depth of about 30 nanometers, the depths of the maximum concentration values of the first and second impurities are about 30 nanometers to 40 nanometers when the thickness of the SOG 21 is set to about 10 nanometers or smaller. In this case, the concentration profiles of the first and second impurities can still be kept shallower than the depth of the grooves 16a of the alignment marks, Other structures and manufacturing method of the template substrate 1 according to the second embodiment can be identical to corresponding ones of the structures and manufacturing method of the template substrate 1 according to the first embodiment.

Therefore, the second embodiment can obtain effects identical to those of the first embodiment. Furthermore, because the glass film is provided on the front surface Fr1 of the mesa region R1 in the second embodiment, the front surface Fr1 of the mesa region R1 can be substantially flattened.

In the embodiments described above, two kinds of impurities are implanted to the impurity implantation regions 15, However, three or more kinds of impurities can be implanted to the impurity implantation regions 15. In this case, it suffices that at least two kinds of impurities comply with the first and second impurities described above.

While certain embodiments have been described, these embodiments have been presented by way of example only, and are not intended to limit the scope of the inventions, Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A template substrate comprising:
a first face;
a second face on an opposite side to the first face;
a first region located on the first face to be protruded from a peripheral portion thereof; and
a second region located at least at an end portion of the first region, the second region in which an alignment mark used at a time of transfer of a pattern is intended to be formed, and the second region containing a first impurity and a second impurity,
wherein
an ionization tendency of an element as the second impurity is smaller than that of an element as the first impurity, and
an atomic weight of the element as the first impurity is smaller than that of the element as the second impurity.

2. The template substrate of claim 1, wherein a depth at which a concentration of the first impurity has a maximum value and a depth at which a concentration of the second impurity has a maximum value are substantially same.

3. The template substrate of claim 1, further comprising a glass film provided on the first face.

4. The template substrate of claim 2, further comprising a glass film provided on the first face.

5. The template substrate of claim 1, wherein
the first impurity is at least one element among magnesium, titanium, aluminum, zirconium, and manganese, and
the second impurity is at least one element among chromium, molybdenum, zinc, cobalt, nickel, tin, lead, antimony, copper, silver, gold, and platinum.

6. The template substrate of claim 1, wherein the first impurity and the second impurity are implanted to have maximum concentration values at a position closer to a front surface of the first region than a position being a bottom surface of the alignment mark.

7. A template substrate comprising:
a first face;
a second face on an opposite side to the first face;
a first region located on the first face to be protruded from a peripheral portion thereof; and
a second region located at least at an end portion of the first region, and containing a first impurity and a second impurity, the first impurity comprising at least one element among magnesium, titanium, aluminum, zirconium, and manganese and the second impurity comprising at least one element among chromium, molybdenum, zinc, cobalt, nickel, tin, lead, antimony, copper, silver, gold, and platinum.

8. The template substrate of claim 7, wherein a depth at which a concentration of the first impurity has a maximum value and a depth at which a concentration of the second impurity has a maximum value are substantially same.

* * * * *